(12) United States Patent
Eldridge et al.

(10) Patent No.: US 7,731,503 B2
(45) Date of Patent: Jun. 8, 2010

(54) CARBON NANOTUBE CONTACT STRUCTURES

(75) Inventors: Benjamin N. Eldridge, Danville, CA (US); John K. Gritters, Livermore, CA (US); Igor Y. Khandros, Orinda, CA (US); Rod Martens, Livermore, CA (US); Gaetan L. Mathieu, Varennes (CA)

(73) Assignee: FormFactor, Inc., Livermore, CA (US)

( * ) Notice: Subject to any disclaimer, the term of this patent is extended or adjusted under 35 U.S.C. 154(b) by 912 days.

(21) Appl. No.: 11/466,039

(22) Filed: Aug. 21, 2006

(65) Prior Publication Data

US 2010/0112828 A1 May 6, 2010

(51) Int. Cl.
*H01R 12/00* (2006.01)

(52) U.S. Cl. .......................................... 439/66; 439/887

(58) Field of Classification Search .................... 439/66, 439/81, 886, 887, 931
See application file for complete search history.

(56) References Cited

U.S. PATENT DOCUMENTS

| | | | |
|---|---|---|---|
| 6,020,747 A | 2/2000 | Bahns et al. |
| 6,626,684 B1 | 9/2003 | Stickler et al. |
| 6,933,222 B2 | 8/2005 | Dubin et al. |
| 6,979,244 B2 | 12/2005 | Den et al. |
| 7,012,441 B2 | 3/2006 | Chou et al. |
| 7,082,683 B2 | 8/2006 | Han et al. |
| 7,137,830 B2 | 11/2006 | Lahiri et al. |
| 7,378,328 B2 | 5/2008 | Choi et al. |
| 7,400,159 B2 | 7/2008 | Wang et al. |
| 7,585,548 B2 | 9/2009 | Wang et al. |
| 2003/0010910 A1 | 1/2003 | Colbert et al. |
| 2004/0110003 A1 | 6/2004 | Cumings et al. |
| 2004/0208788 A1 | 10/2004 | Colton |
| 2006/0028220 A1 | 2/2006 | Malantonio et al. |
| 2006/0071334 A1 | 4/2006 | Kawabata et al. |
| 2006/0103406 A1 | 5/2006 | Kitazawa et al. |
| 2006/0197547 A1 | 9/2006 | Chen |
| 2006/0290343 A1 | 12/2006 | Crafts et al. |
| 2007/0051887 A1 | 3/2007 | Hidaka et al. |
| 2007/0155158 A1 | 7/2007 | Gstrein et al. |
| 2007/0158768 A1 | 7/2007 | Pilchowski et al. |
| 2007/0164214 A1 | 7/2007 | Choi et al. |
| 2007/0186665 A1 | 8/2007 | Hierold et al. |
| 2007/0235713 A1 | 10/2007 | Swirbel |
| 2009/0066352 A1 | 3/2009 | Gritters et al. |
| 2009/0091343 A1 | 4/2009 | Wu et al. |

(Continued)

OTHER PUBLICATIONS

U.S. Appl. No. 12/418,438, filed Apr. 3, 2009, Fang et al.

(Continued)

*Primary Examiner*—Khiem Nguyen
(74) *Attorney, Agent, or Firm*—N. Kenneth Burraston

(57) ABSTRACT

A carbon nanotube contact structure can be used for making pressure connections to a DUT. The contact structure can be formed using a carbon nanotube film or with carbon nanotubes in solution. The carbon nanotube film can be grown in a trench in a sacrificial substrate in which a contact structure such as a beam or contact element is then formed by metal plating. The film can also be formed on a contact element and have metal posts dispersed therein to provide rigidity and elasticity. Contact structures or portions thereof can also be plated with a solution containing carbon nanotubes. The resulting contact structure can be tough, and can provide good electrical conductivity.

18 Claims, 11 Drawing Sheets

U.S. PATENT DOCUMENTS

2009/0197484 A1    8/2009    Chen et al.

OTHER PUBLICATIONS

U.S. Appl. No. 12/418,368, filed Apr. 3, 2009, Gritters et al.
U.S. Appl. No. 12/421,805, filed Apr. 10, 2009, Chen et al.
Int'l Search Report and Written Opinion, PCT application PCT/US2007/076345 (Apr. 2, 2008), 9 pages.
Int'l Preliminary Report on Patentability, PCT application PCT/US2007/076345 (Mar. 5, 2009), 6 pages,
U.S. Appl. No. 11/872,008, filed Oct. 13, 2007, Gritters et al.
Moloni et al., "Sharpened Carbon Nanotube Probes" (University of Wisconsin-Madison) (no date but downloaded from Internet on Sep. 6, 2007).
Pushparaj et al., "Effects of compressive strains on electrical conductivities of a macroscale carbon nanotube block," Applied Physics Letters 91, 153116 (2007).
Yaglioglu et al., "Transfer and Reinforcement of Carbon Nanotube Structures with Epoxy," (presented at NTOG conference in Japan, Jun. 2006).
Yaglioglu, "Carbon Nanotube Based Electromechanical Probes," Thesis (Massachusetts Institute Of Technology Jun. 2007).
U.S. Appl. No. 12/632,428, filed Dec. 7, 2009, Eldridge et al.
Yaglioglu et al., "Conductive Carbon Nanotube Composite Micro-Probes," Advanced Materials (2008), 20, pp. 357-362.
Greene, "Researchers Make Carbon Nanotubes Without Metal Catalyst," MIT News (Aug. 10, 2009) (2 pages).

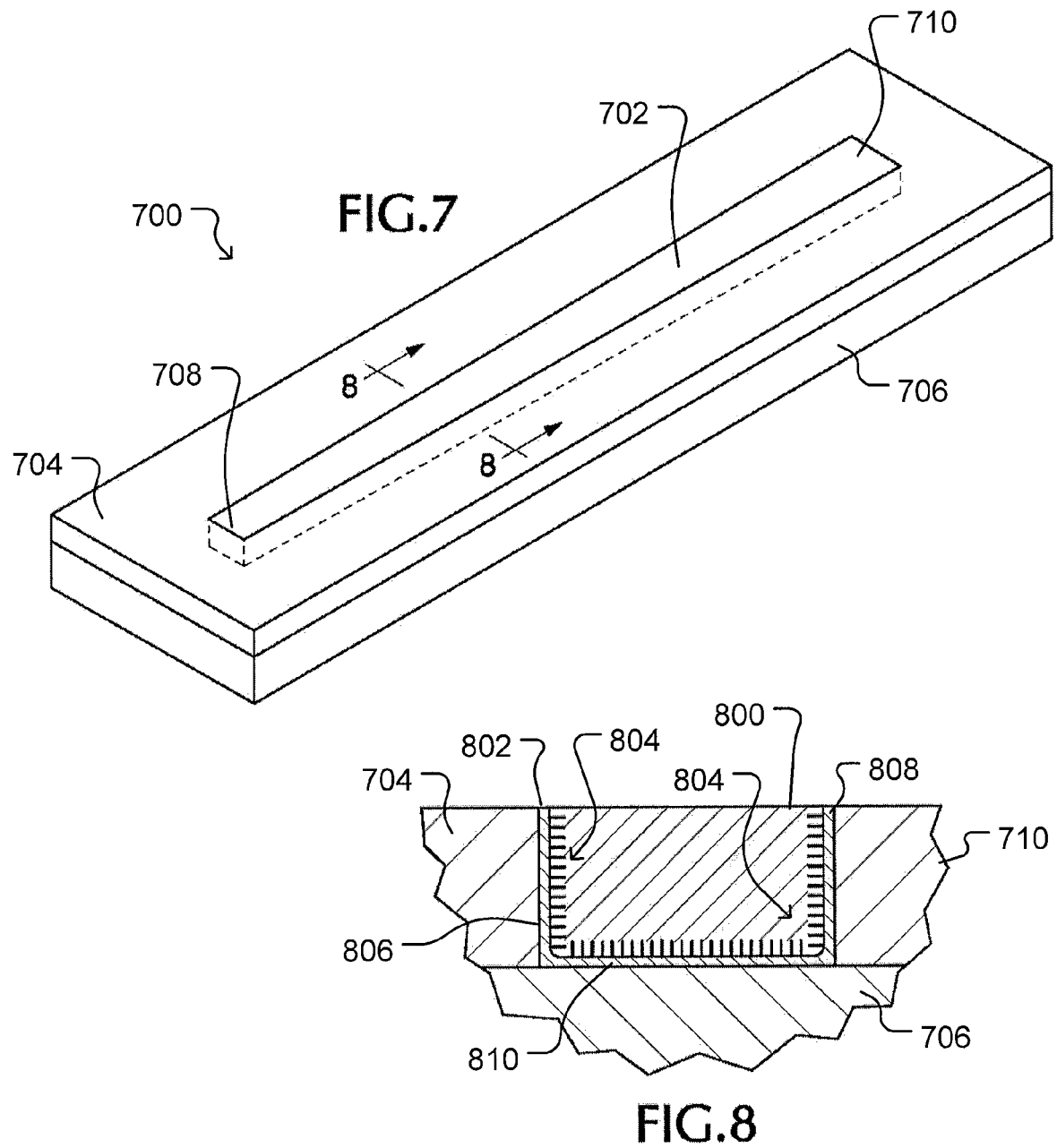

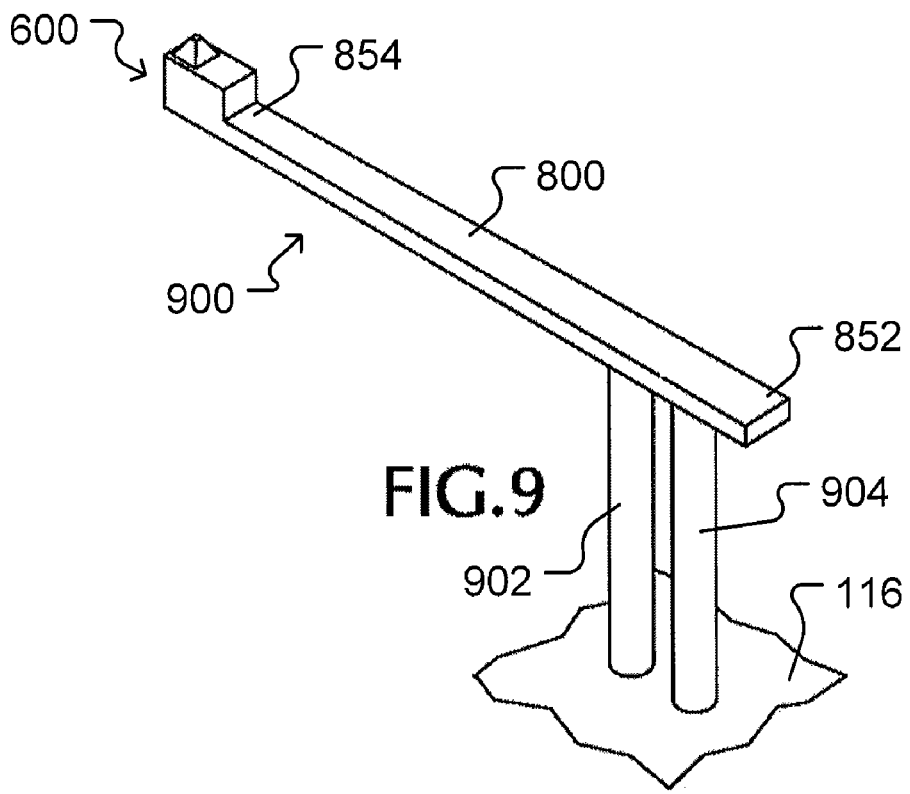
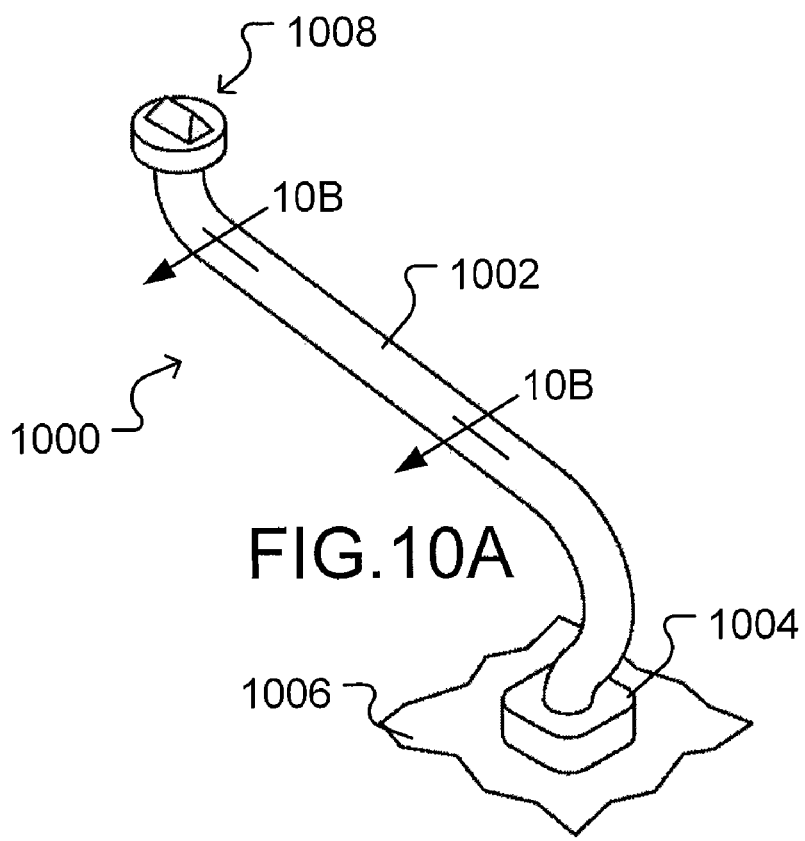

CARBON NANOTUBE CONTACT STRUCTURES

FIELD OF THE INVENTION

The present invention relates to carbon nanotubes and more particularly to carbon nanotubes in films and in solution.

BACKGROUND OF THE INVENTION

Carbon nanotubes have received attention based upon their extremely small size, high strength and excellent electrical and thermal conductivity characteristics. However, challenges arise when working with carbon nanotubes. For example, a film of aligned carbon nanotubes has electrical connectivity throughout the film. But each carbon nanotube may act independently, and the film deforms plastically. The film does not have the rigidity and elasticity desired for test interconnection elements or contact structures to form a positive connection to a device under test.

Carbon nanotubes may also be applied in a plating solution, which results in a coating of the plated object that includes the carbon nanotubes. In this form, the carbon nanotubes do not exhibit high plasticity as a result of being affixed to the object.

BRIEF DESCRIPTION OF THE DRAWINGS

FIG. 7 is a perspective view of a sacrificial substrate and related materials illustrating a portion of an exemplary method for making a contact structure incorporating carbon nanotubes.

FIG. 8 is an enlarged view taken along line 8-8 in FIG. 7.

FIG. 9 is a perspective view of a contact structure incorporating carbon nanotubes.

FIG. 10A is a perspective view of another contact structure incorporating carbon nanotubes.

Figure 1:
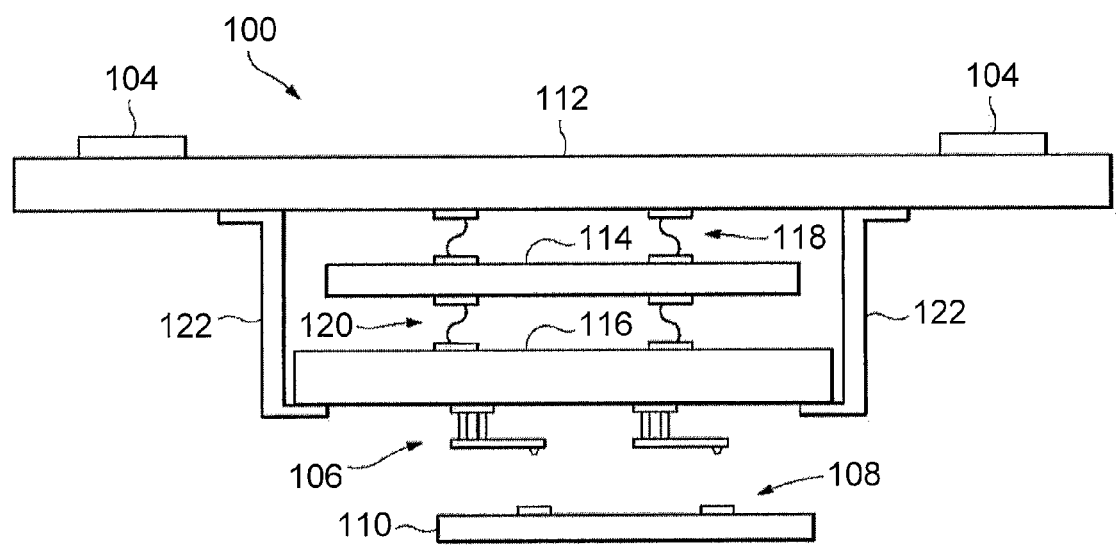
FIG. 1 is a block diagram view of a probe card assembly including a probe head mounted thereon according to some embodiments of the invention.

The Figures presented in conjunction with this description are views of only particular—rather than complete—portions of the devices and methods of making the devices. Together with the following description, the Figures demonstrate and explain the principles of such devices and methods according to some embodiments of the invention. In the Figures, the thickness of layers and regions may be exaggerated in some instances for clarity. It will also be understood that when a layer is referred to as being "on" another layer or substrate, it can be directly on the other layer or substrate, or intervening layers may also be present. The same reference numerals in different drawings represent the same element, and thus their descriptions will be omitted.

DETAILED DESCRIPTION

Exemplary embodiments of the invention now will be described more fully with reference to the accompanying drawings. This invention may, however, be embodied in many different forms and should not be construed as being limited to the embodiments and aspects set forth herein. Although the exemplary embodiments are described with respect to probe tips for testing semiconductor dies, the invention is not so limited but can be used in any probing application.

In general, some embodiments of the invention provide contact elements for a probe, which is also referred to herein as a contact structure. The contact elements, or the entire probe, may be made from carbon nanotube structures that have carbon nanotubes incorporated therein in a variety of ways. In one aspect, the carbon nanotubes may be grown on a film in a trench in which components of the probe are lithographically formed. In another aspect the carbon nanotubes may be in a plating solution that is used to plate a probe or a probe contact element. In still other aspects, the entire probe or contact element may substantially comprise carbon nanotubes. In implementations that include carbon nanotube films, the films may be patterned to provide areas in which metal is formed to resist plastic deformation of the carbon nanotubes.

A non-limiting exemplary probe card assembly 100 illustrated in FIG. 1 can be used to test one or more devices under test (DUTs) in accordance with some embodiments of the invention. DUTs can be any electronic device or devices to be tested. Non-limiting examples of DUTs include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. Note that the term DUT, as used herein, refers to one or a plurality of such electronic devices.

Probe card assembly 100 can include electrical connectors 104, which can make electrical connections with a plurality of tester channels (not shown) from the tester (not shown). Probe card assembly 100 can also include contact structures 106 configured to be pressed against and thus make electrical connections with input and/or output terminals 108, which are referred to herein as contact pads, of a DUT 110 (for example). DUT 110 in this example can comprise a semiconductor device having contact pads 108 thereon. In some embodiments, contact structures 106 can have resilient or spring-like properties.

Probe card assembly 100 can also include one or more substrates configured to support connectors 104 and contact structures 106 and provide electrical connections between connectors 104 and contact structures 106. The exemplary probe card assembly 100 shown in FIG. 1 has three such substrates, although in other implementations, probe card assembly 100 can have more or fewer substrates. Shown in FIG. 1 are a wiring substrate 112, which may be a probe card, an interposer substrate 114, and a probe substrate 116. Wiring substrate 112, interposer substrate 114, and probe substrate 116 can be made of any type of material. Examples of suitable substrates include without limitation a printed circuit board, a ceramic substrate, an organic or inorganic substrate, etc. Combinations of the foregoing are also possible.

Electrical connections (not visible) can be provided from connectors 104 through wiring substrate 112 to electrically conductive spring interconnect structures 118. Other electrical connections (not visible) can be provided from spring interconnect structures 118 through interposer substrate 114 to electrically conductive spring interconnect structures 120, and still other electrical connections (not visible) can be provided from spring interconnect structures 120 through probe substrate 116 to contact structures 106. The electrical connections (not shown) through the wiring substrate 112, interposer substrate 114, and probe substrate 116 can comprise electrically conductive vias, traces, etc. on, within, and/or through wiring substrate 112, interposer substrate 114, and probe substrate 116.

Wiring substrate 112, interposer substrate 114, and probe substrate 116 can be held together by brackets 122 and/or other suitable means. The configuration of probe card assembly 100 shown in FIG. 1 is exemplary only and is simplified for ease of illustration and discussion. Many variations, modifications, and additions are possible. For example, a probe card assembly 100 can have fewer or more substrates (e.g., 112, 114, 116) than the probe card assembly 100 shown in FIG. 1. As another example, the probe card assembly 100 can have more than one probe substrate (e.g., 116), and each such probe substrate can be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,622 and U.S. Pat. No. 6,509,751 and the aforementioned U.S. patent application Ser. No. 11/165,833, filed Jun. 24, 2005, and various features of the probe card assemblies described in those patents and application can be implemented in the probe card assembly 100 show in FIG. 1.

Figure 4:
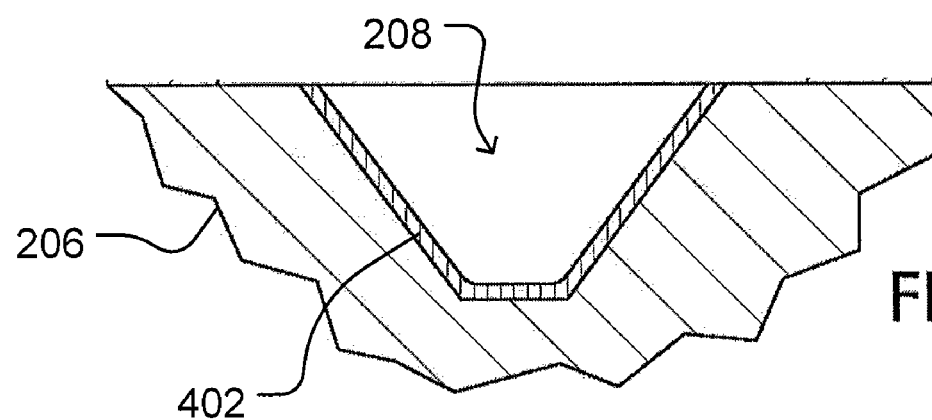
FIG. 4 is an enlarged view of the structure shown in FIG. 3, depicting a portion of an exemplary method for making a contact structure incorporating carbon nanotubes.
Figure 5:
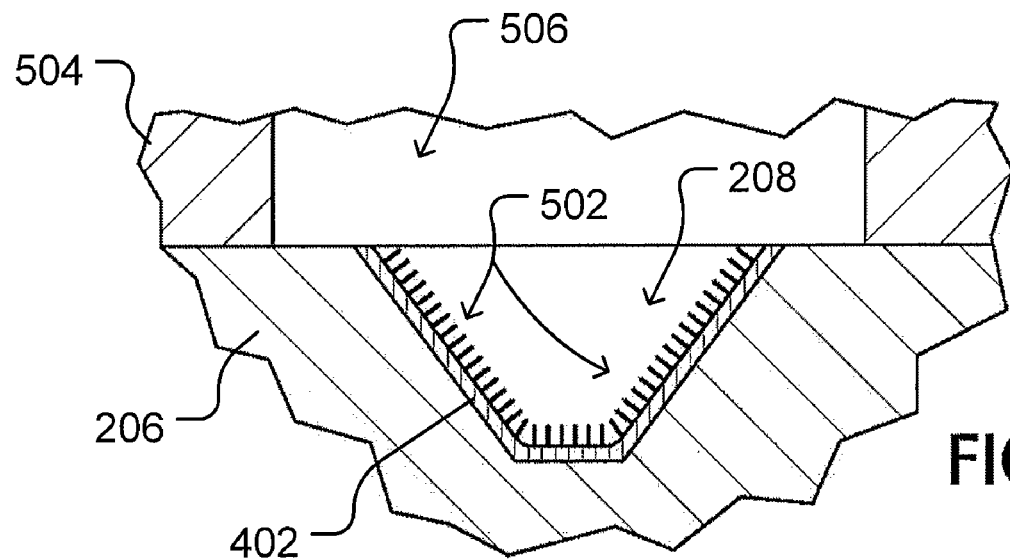
FIGS. 5 and 6 are views similar to FIG. 4 depicting a portion of an exemplary method for making a contact structure incorporating carbon nanotubes.
Figure 6:
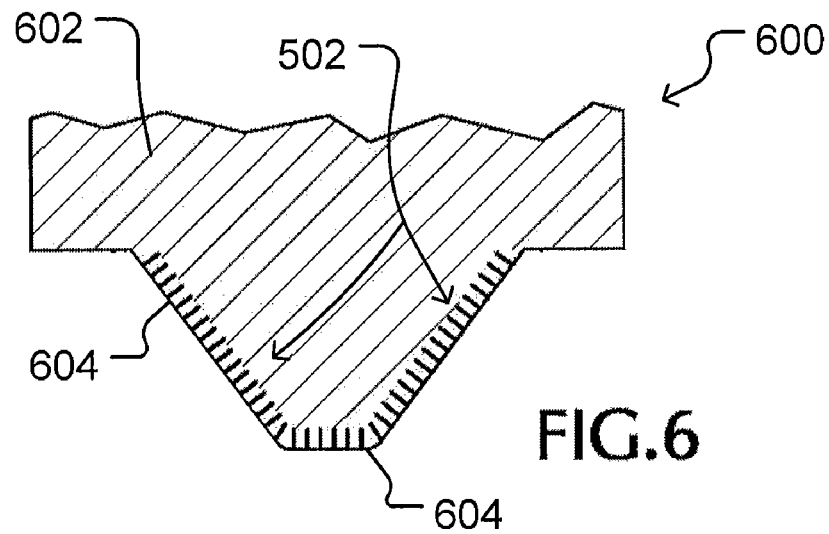

FIGS. 2-6 show components, in a simplified fashion, of lithographic forms and a contact element, indicated generally at 600 in FIG. 6, during exemplary steps for fabricating the contact element 600. Contact element 600 is also referred to herein as a tip. The steps described below for fabricating the contact element and for attaching the contact element to a beam, which is also referred to herein as an interconnection element, are only one of many possible contact elements and joining methods that may be used to implement various embodiments of the present invention. Many other types of contact elements may be combined with the beam, with other types of beams, with wires, or with any other type of interconnection element for a contact element without departing from the scope of the invention.

Figure 2:
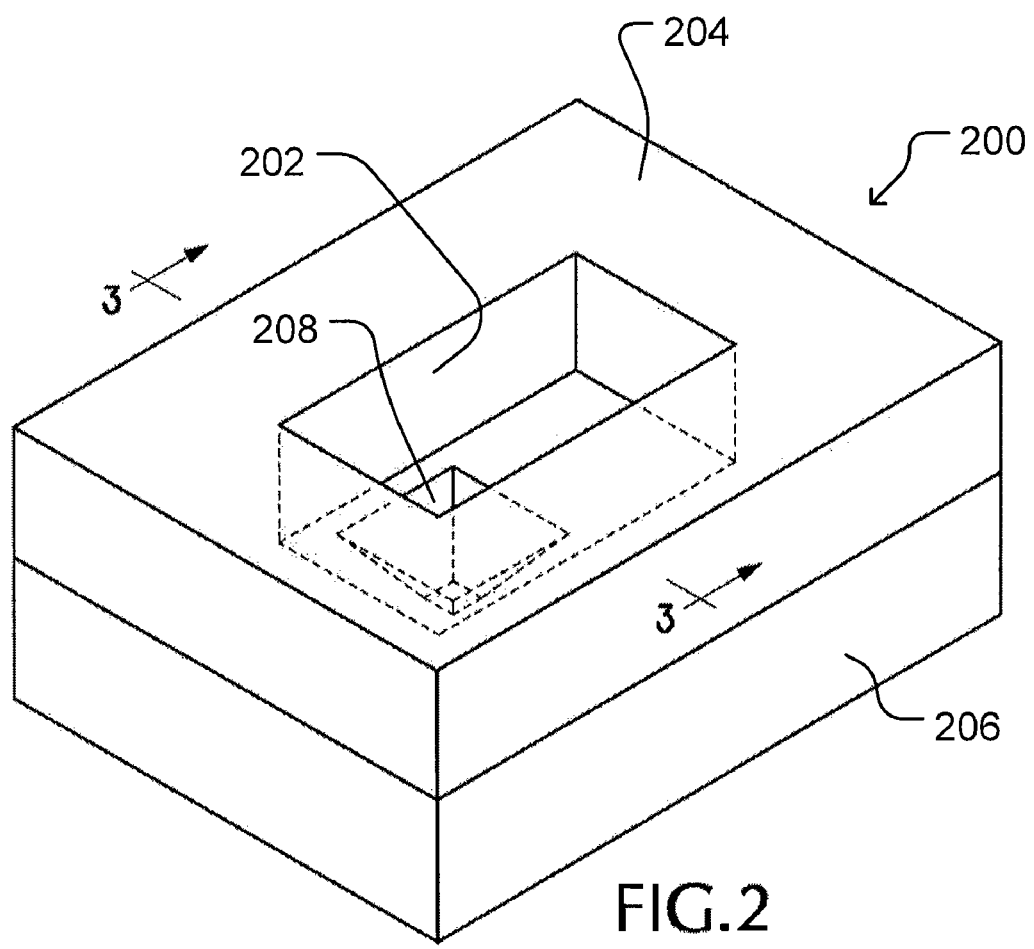
FIG. 2 is a perspective view of a sacrificial substrate and related materials illustrating a portion of an exemplary method for making a contact structure incorporating carbon nanotubes.

Considering first FIG. 2, indicated generally at 200 can be a lithographic form for fabricating contact element 600. An opening 202 can be formed in a layer of masking material 204. The opening 202 may be formed lithographically or in any other suitable fashion. The masking material 204 may be photoresist or any other suitable type of masking material. The masking material 204 can be disposed on the surface of a sacrificial substrate 206. Substrate 206 may be silicon or any other suitable substrate. There may also be one or more release layers (not shown) between substrate 206 and masking layer 204, but any other method for releasing contact element 600 from the substrate may be used, whether or not a release layer is involved.

Figure 3:
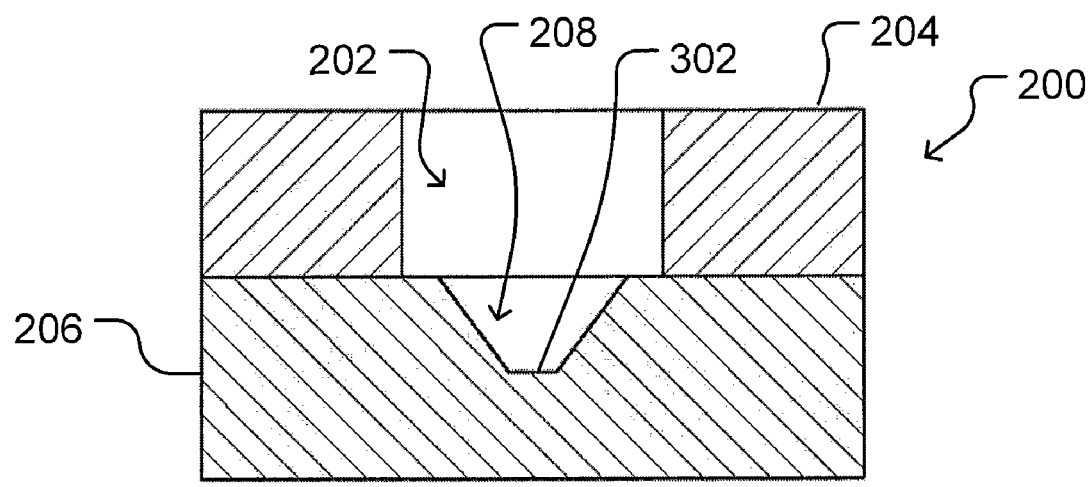
FIG. 3 is a view taken along line 3-3 in FIG. 2.

A pit 208, also viewable in FIG. 3, can be etched into substrate 206 using any suitable etching method although other methods may be used to form pit 208 as shown in the drawings. Pit 208, for example, can be formed by allowing etching to proceed in silicon substrate 206, which has anisotropic etch properties, until a self-limiting point is reached. This produces a pit shaped like an inverted pyramid. Alternatively, and as shown in the drawings, etching may be stopped before the self-limiting point is reached thus producing a pit shaped like pit 208, namely an inverted truncated pyramid with a small flat apex 302, as shown in FIG. 3. Etching of a pit, like pit 208, may be eliminated completely if a more planar contact element is desired.

After formation of pit 208, masking layer 204 may be removed from substrate 206, although as will soon be seen, this masking layer 204 can be later replaced with another masking layer 504 in FIG. 5, and it may be possible to simply retain masking layer 204 in place, rather than removing it. In any event, the present example contemplates removing masking layer 204, as shown in FIG. 4.

Also shown in FIG. 4 is a catalyst layer 402, which is also referred to herein as a base, is deposited into pit 208 and lines the surface of pit 208 as shown. The catalyst layer 402 may be a metal seed layer for growing a carbon nanotube film indicated generally at 502 in FIG. 5. The carbon nanotube film 502 is depicted schematically by lines extending from catalyst layer 402. There are various known ways for growing carbon nanotube film, like film 502, on a catalyst layer, like catalyst layer 402. Any of these ways may be suitable for implementing the present invention. All of them grow a film of carbon nanotubes, which refer to single-walled or multi-walled structures of carbon atoms formed into a tube with a hollow core. The nanotubes and nanotube films grown and contemplated for use in the embodiments described herein are excellent electrical conductors and very strong, in terms of tensile strength and elastic modulus. Another property that may have some disadvantages is that carbon nanotube films are typically plastic, i.e., they deform easily when on their own. Put differently, they may be readily deformed when not part of a composite—or otherwise incorporated into other structures or with other structure incorporated therein.

After the carbon nanotube film 502 is formed as shown in FIG. 5, further steps in the process may include depositing layers of titanium (not shown), copper (not shown), aluminum (not shown), or other metals or materials, on substrate 206. These layers may all be deposited sequentially or only one or two layers may be deposited. Such depositing may be by sputtering or any other suitable method. Alternatively, none of these layers are deposited, as shown in the drawings.

A second masking layer 504 can be applied over sacrificial substrate 206 and metal layers, if any, thereon. Layer 504 may be deposited uniformly to a thickness that is at least as thick as the desired thickness of contact element 600. Typical thicknesses can be 25 to 250 micrometers, although other thicknesses may be used. Second masking layer 504 is patterned in a known manner to have an opening 506 that is aligned with pit 208.

After opening 506 is formed as described, it is filled with one or more layers of metallic material 602, in FIG. 6. Any suitable lithographic process may be used to deposit the layers of metallic material 602 in a manner and to depths that are known in the art. Once the metallic layer 602 is deposited, masking layer 504 is stripped away using any suitable solvent, and contact element 600 is released from sacrificial substrate 206 in a known manner.

This processing may remove or partially remove catalyst layer 402 as shown in FIG. Catalyst layer 402 can alternatively be left in place. If removed, the catalyst layer 402 can be removed by etching or otherwise, leaving carbon nanotube film 502 communicating with a surface 604 of contact element 600. This communication may be by exposing portion of the carbon nanotube film that is flush with surface 604. Alternatively, a surface layer of contact element 600 may be slightly etched using an etchant that etches the metal from which contact element 600 is formed, but not the carbon nanotube film 502. This results in a shallow layer of film (not shown) that is exposed on surface 604 creating what might be thought of as a "bearded" embodiment (not shown), i.e., one in which some of the carbon nanotubes in film 502 extend from the surface 604 of contact element 600. This provides a strong, high-conductivity structure for contacting a pad on a semiconductor device. And because film 502 is incorporated into contact element 600, it is held fixedly in place and supported as the protruding "beard" portion of carbon nanotube film 502 is urged against the contact pad 108 of a DUT 110 (FIG. 1).

The contact element 600 can alternatively be formed as follows. Rather than grow, or in addition to growing, the carbon film 502, carbon nanotubes can be imbedded in the material 602 deposited into pit 208 and opening 506. Thus, carbon nanotubes can be distributed throughout the material 602 shown in FIG. 6. For example, material 602 can be electroplated onto layer 402, and the plating solution from which material 602 is plated can comprise nanotubes.

FIGS. 7 and 8 depict a lithographically formed mold, indicated generally at 700, for forming a beam 800, in FIG. 8, for a contact structure. In FIG. 7, an opening 702 is formed in a layer of masking material 704 that is formed on a sacrificial substrate 706. A release layer (not shown) may be deposited between masking layer 704 and sacrificial substrate 706, although techniques are known for forming beam 800 without such a release layer. Additional layers, such as a shorting layer (not shown), may also be formed.

As can be seen in FIG. 7, opening 702 can include opposing ends 708, 710, with end 708 being narrower than end 710 thereby defining a trapezoidal shape. It should be appreciated that any shaped beam or other interconnection element can alternatively be used.

As shown in FIG. 8, after form 700 is created, a catalyst layer 802 can be deposited in opening 702. As with catalyst layer 402 in FIGS. 4-6, catalyst layer 802 may comprise a metal seed layer that is deposited in a known manner and used to grow a carbon nanotube film 804, also in a known manner. The catalyst layer 802 could be applied only to one or the other of the sides 806, 808 of opening 702 or only the lower surface 810. In addition the film need not be applied to the entirety of any of surfaces 806, 808, 810. Or it could be applied to them all as shown in FIG. 8. After film 804 is grown, opening 702 is filled with one or more layers of metallic material, resulting in beam 800. A variety of methods may be used to deposit such a layer or layers, including but not limited to electroplating, CVD, PVD, or sputtering. Further techniques are also known and may be used to implement the invention. As can be seen in FIG. 9, beam 800 can include a wide end 852, which was formed in opening 702 at end 710, and a narrow end 854, which was formed toward end 708 in opening 702.

The beam 800 can alternatively be formed as follows. Rather than grow, or in addition to growing, the carbon film 804, carbon nanotubes can be imbedded in the material deposited into opening 702 to form the beam 800. In this way, carbon nanotubes can be distributed throughout the beam 800. For example, beam 800 can be formed by electroplating material forming the beam into opening 702, and the plating solution from which material forming beam 800 is plated can comprise nanotubes.

After removing masking material 704 from the configuration shown in FIG. 8, solder paste (not shown) or equivalent material (also not shown) can be applied to the upper surface, as viewed in FIG. 9, of beam 800 and/or to ends of posts 902, 904. Next, beam 800 can be inverted and the solder or other material can be used to join beam 800 to the ends of posts 902, 904. Then beam 800 can be released from sacrificial substrate 706 by application of heat or solvent or by any other suitable manner to produce the structure of FIG. 9, less the contact element 600. Contact element 600 may be affixed to beam 800 in a known manner, e.g., using solder paste. Although it should be appreciated that any technique for joining contact element 600 to beam 800 could be used to form the structure of FIG. 9. As another alternative, contact element 600 and beam 800 can be integrally formed.

Beam 800, contact element 600 and posts 902, 904 can be collectively referred to as a probe or contact structure, indicated generally as 900 in FIG. 9. Posts 902, 904 can be joined to terminals (not visible), in a known manner, on substrate 116 (also visible in FIG. 1). Rather than being formed in an opening 702 in a masking material 704, the beam 800 can be formed in an opening (not shown) etched or otherwise formed in sacrificial substrate 706. As yet another alternative, the beam 800 can be formed in a combination of an opening (not shown) formed in the sacrificial substrate 706 and the opening 702 in masking material 704, which can, for example, be located over the opening (not shown) in the sacrificial substrate 706. Although two are shown, more or fewer posts 902, 904 can be used.

The exemplary contact structure 900 may be implemented with both carbon nanotube film 502 on contact element 600 (see FIG. 6), and carbon nanotube film 804 on beam 800, or it could be implemented with only one or only the other of films 502, 804. The carbon nanotube film 804 formed on surface 810 is in the upper surface 902 of beam 800 in FIG. 9. As can be seen in FIG. 1, when probe or contact element 900 can be urged against a semiconductor pad 108 beam 800 may flex in a downward direction, as viewed in FIG. 9. This puts the carbon nanotube film 804 formed beneath surface 902 in tension. Film 804 thus increases the toughness of beam 800 by acting to resist beam cracking. Other materials can be formed or deposited along the axis of the beam 800 to add or enhance selected properties or features of the beam 800. For example, a highly conductive material (e.g., copper) can be formed or deposited to promote electrical conductivity of the beam 800. A highly resilient material can be formed or deposited to promote resilience of the beam 800.

An alternative embodiment of the invention can be implemented in a contact structure 1000, shown in FIG. 10A. Contact structure 1000 can include a body 1002 (which can be, for example, a wire) that can function as an interconnection element. Body 1002—which can have resilient or spring-like properties—can be mounted on a terminal 1004 that can in turn be affixed to a substrate 1006. Substrate 1006 may be a probe substrate, like substrate 116 in FIG. 1, except that the probes are like contact structure 1000 in FIG. 10A rather than like contact structure 900 in FIG. 9.

Contact structure 1000 further can include a contact element 1008 that can be mounted on the upper end of body 1002 in a known manner. Contact element 1008 may be lithographically formed in a manner similar to contact element 600, except that it has a different shape as can be seen by comparing contact element 1008 in FIG. 10A with contact element 600 in FIG. 9. Contact element 1008 can, however, take different shapes than shown in FIG. 10A. For example, contact element 1008 can be generally square, rectangular, oval, etc. rather than the generally circular shape illustrated in FIG. 10A.

Figure 10B:
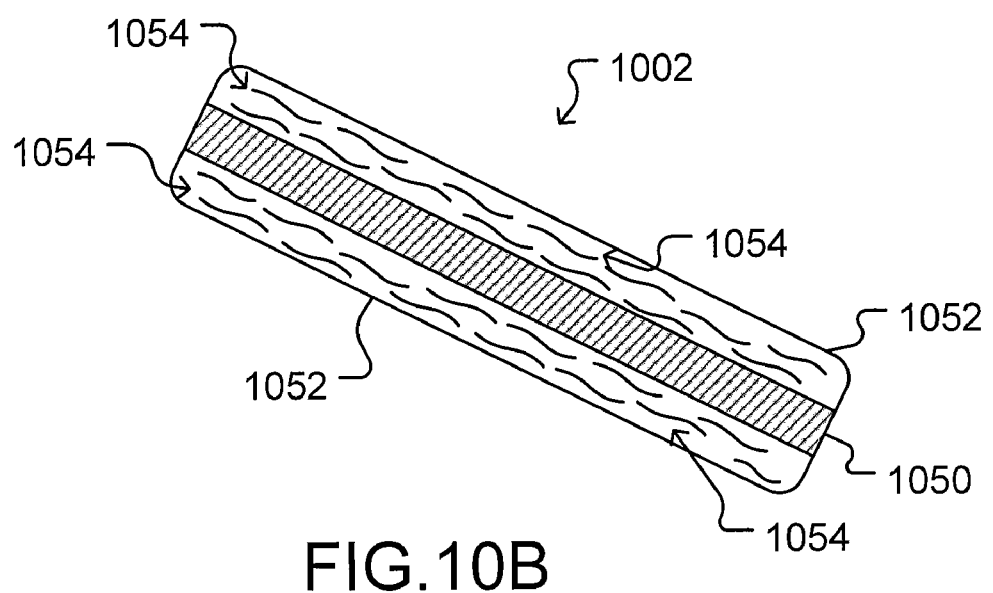
FIG. 10B is a cross sectional view of the body of the contact structure of FIG. 10A taken along line 10B-10B in FIG. 10A.

As is known in the art and illustrated in FIG. 10B, body 1002 may be formed from a relatively soft core 1050, such as a gold wire, which can then be overcoated with a hard material 1052 having a relatively high yield strength. For example, the gold wire may be coated with nickel and its alloys via electrochemical plating. Conversely, a relatively hard core may be formed, by stamping or other processes, which can then be plated with a good contact material, such as gold.

In any event, body 1002 may be plated, using known plating techniques (e.g., electrochemical plating), with a plating solution that can include carbon nanotubes 1054. Carbon nanotubes are often supplied suspended in solution and may be readily incorporated into a plating solution for plating body 1002. Moreover, in some embodiments, the nanotubes 1054 can have an affinity for the core 1052 and can naturally align themselves generally along their lengths with the core 1050 as shown in FIG. 10B. For example, if core 1052 is a copper wire, nanotubes 1054 in the plating solution can tend to align themselves along their lengths, as shown in FIG. 10B, as material form the plating solution plates onto the copper wire forming over coat 1054. This can enhance toughness and conductivity of body 1002. It should be appreciated that the body 1002 can be plated, the contact element 1008 can be plated, or the body 1002 and the contact element 1008 can be plated in accordance with such plating techniques. In brief, either one of or both of contact element 1008 and body 1002 may include carbon nanotubes. And these nanotubes may be incorporated via growing a film in connection with a lithographic process, as described in connection with FIGS. 2-8, by plating, as just described, or both by growing the film and plating.

Figure 11:
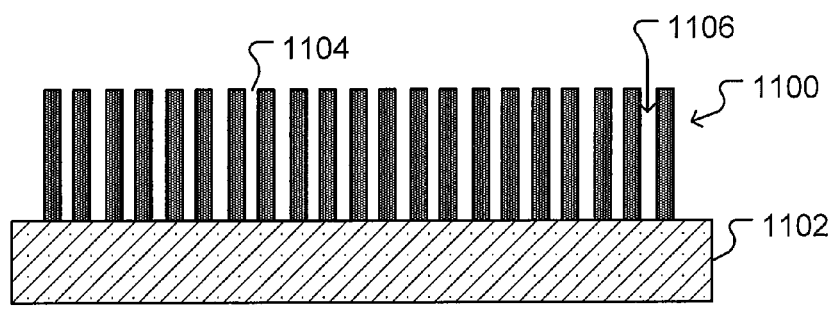
FIGS. 11-13 are sequential views of a process for growing an aligned carbon nanotube film that may be incorporated into some embodiments of the present invention.
Figure 12:
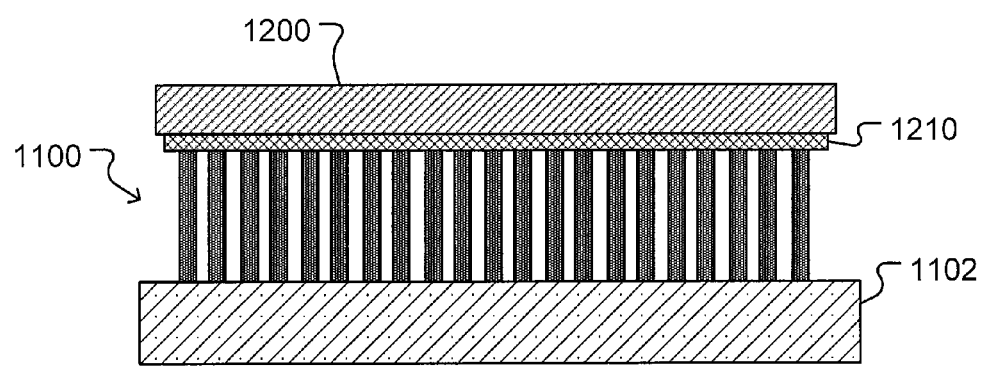
Figure 13:
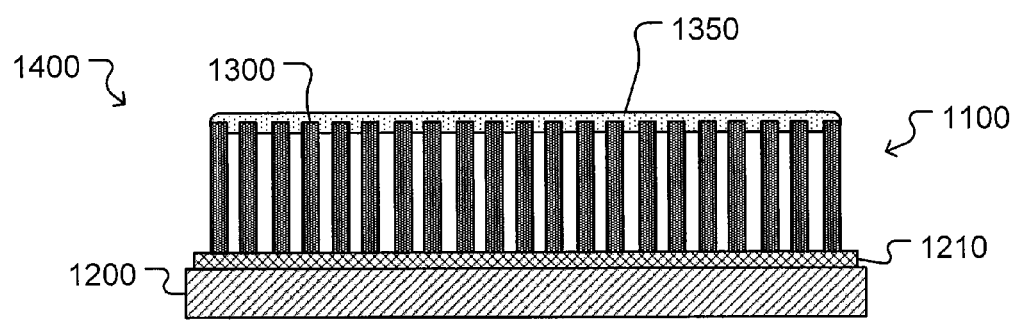

FIGS. 11-13 depict schematic views of a carbon nanotube film and related structure that may be incorporated into some embodiments of the present invention. In FIG. 11, a carbon nanotube film 1100 can be grown on a catalyst substrate 1102. Catalyst substrate 1102, like the other catalyst layers, may be a seed metal that is used to grow a carbon nanotube film. There are several known ways to grow a film of aligned carbon nanotubes on a substrate, and the carbon nanotubes incorporated into embodiments of the present invention may incorporate any of these approaches. In addition, tangled carbon nanotubes are also suited for implementing embodiments of the present invention. As viewed in FIG. 11, catalyst substrate 1102 can first be laid down on a suitable base (not shown) and then carbon nanotube film 1100 can be grown on the catalyst substrate 1100. The resulting film can include internal spaces 1106 in between carbon nanotubes that are relatively compacted together. The carbon nanotubes each have a diameter that may be in the order of a few nanometers. The spaces 1106 between the compacted carbon nanotubes may be in the range of a few microns up to several 10s of microns. This produces a carbon nanotube film that can be relatively plastic, i.e., it is easily deformed.

After carbon nanotube film 1100 is grown, as depicted in FIG. 11, a metal layer 1200 (in FIG. 12), such as copper can be applied to an upper surface 1104 (in FIG. 11) of carbon nanotube film 1100. This may be accomplished by sputtering or by separately forming metal layer 1200 as a metal slug having the shape shown in FIG. 12. In this approach, conductive epoxy 1110—which comprises epoxy impregnated with metal, such as silver—can be applied to surface 1104 of carbon nanotube film 1100. The copper slug comprising metal layer 1200 can then be set on surface 1104 and can thereby be mechanically and electrically connected to carbon nanotube film 1100 via the conductive epoxy 1110.

In FIG. 13, the structure of FIG. 12 is shown inverted and with catalyst layer 1102 removed, thus exposing a surface 1300 of carbon nanotube film 1100. Catalyst layer 1102 can be removed mechanically, e.g., it is ripped from carbon nanotube film 1100, thus leaving the configuration of FIG. 13. The structure of FIG. 13 may be used as a contact element 1400, which can be part of a contact structure or probe, indicated generally at 1402 in schematic form in FIG. 14.

As shown in FIG. 13, a fill layer 1350 can be deposited on the surface 1300 of the carbon nanotube film 1100 in some embodiments of the invention. Layer 1350—which can comprise materials such as silver, rhodium, proballoy, or any other material suitable for tying the ends of the nanotubes that form the film 1100 together—can be deposited in any manner suitable for depositing such materials (e.g., sputtering, electrodeposition, chemical deposition, etc.). Such a layer 1350 can fill gaps between the nanotubes that form the film 1100, which can reduce the likelihood that debris or residue will become lodged or trapped on the contact surface (now formed by material 1350) of the contact element 1400. For example, layer 1350 can prevent debris or residue that might otherwise become lodged or trapped in the gaps between the nanotubes from clinging to the contact element 1400. Layer 1350 can be particularly advantageous in embodiments in which contact element 1400 forms a contact tip for contact structures, like contact structures 106 of FIG. 1, that are used to contact terminals DUT, like DUT 110. In other embodiments, however, layer 1350 is not deposited on the 1300 of the carbon nanotube film 1100.

Figure 14:
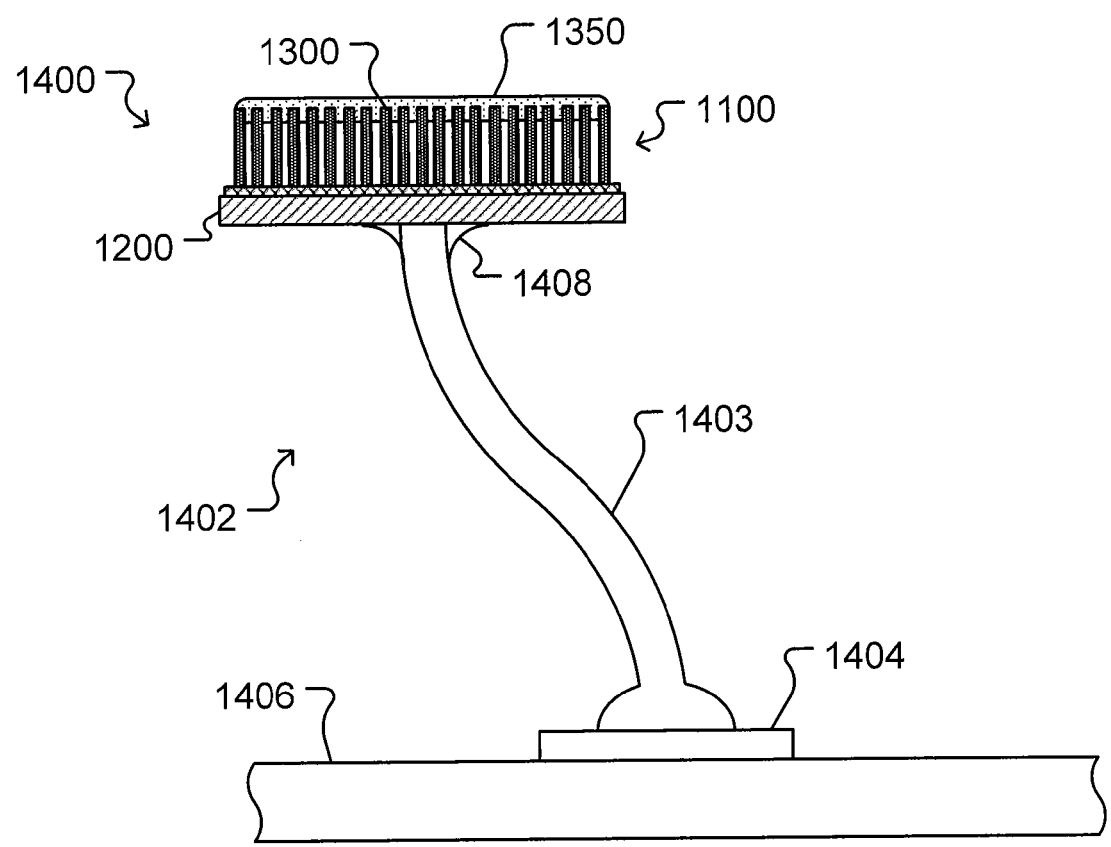
FIG. 14 is a schematic view of a contact structure incorporating carbon nanotubes.

Contact element 1400 can be attached to a body 1403 that is attached to a terminal 1404 on a substrate 1406, which may be a probe substrate, like substrate 116 in FIG. 1, except that the probes can be like contact structure 1402 in FIG. 14 rather than like the contact structures in FIG. 9 or 10. Body 1403 can be, for example, a wire that is bonded to the terminal 1404. Such a wire can, for example, comprise materials and/or be shaped so as to have resilient, spring-like properties. Contact element 1400 can be electrically and mechanically connected to body 1403 via a solder connection 1408. Metal layer 1200 can provide structural rigidity that supports the carbon nanotube film 1100 as surface 1300 is urged against a semiconductor pad, like one of pads 108 in FIG. 1. Film 1100 provides good electrical contact and structural toughness for making repeated pressure connections against pads on DUTs, like DUT 110 in FIG. 1.

Figure 15:
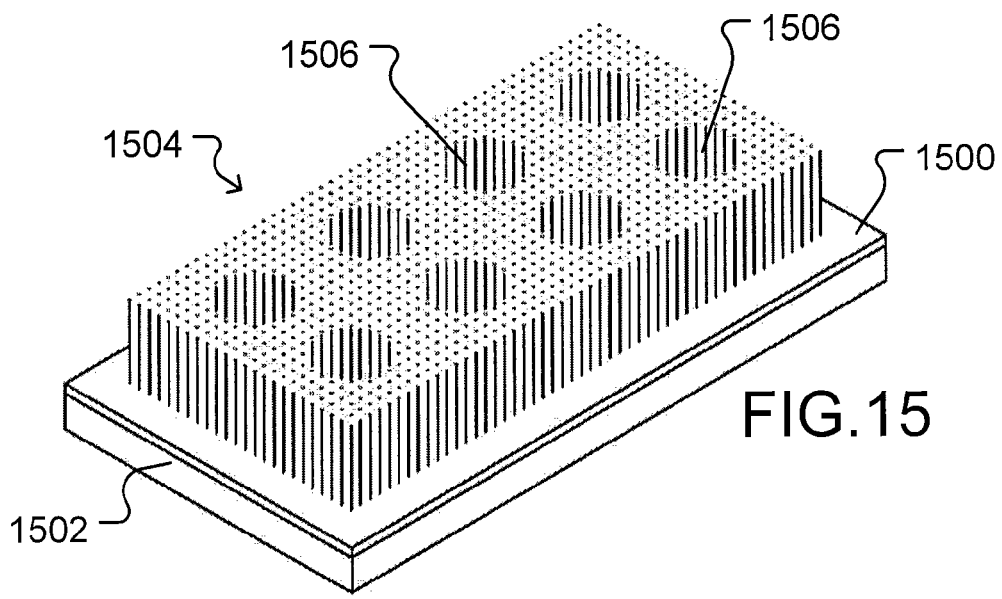
FIG. 15 is a perspective view of a patterned carbon nanotube film.
Figure 16:
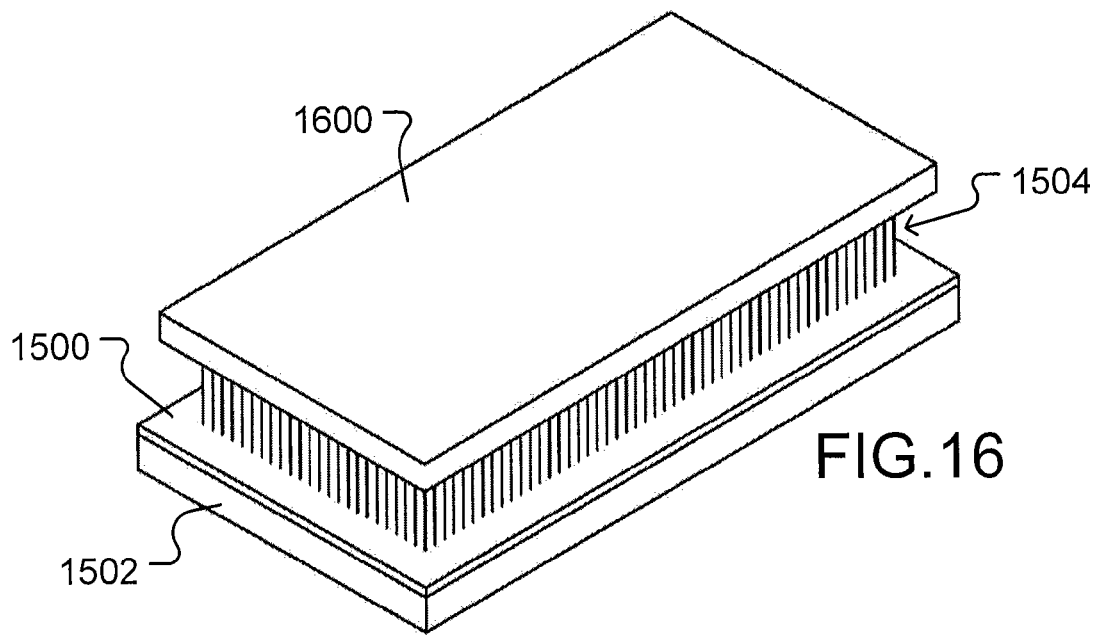
FIG. 16 is a perspective view of the film of FIG. 15 having a metal slug attached to the upper portions of the carbon nanotubes in FIG. 15.
Figure 17:
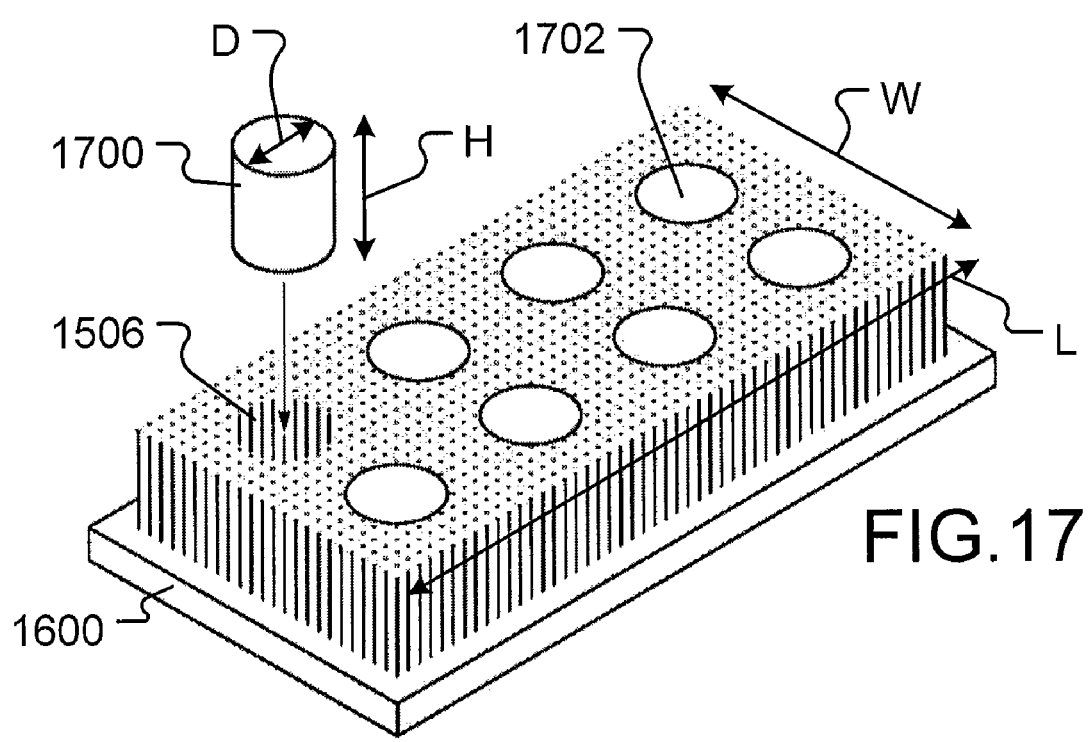
FIG. 17 is a view of the carbon nanotubes of FIG. 16 inverted, with the film removed, and depicting a plurality of metal posts, one of which is shown exploded from the patterned carbon nanotubes.

FIGS. 15-17 are sequential views of a process for growing an aligned carbon nanotube film that may be incorporated into some embodiments of the present invention. In FIG. 15, a catalyst layer 1500, which may comprise a metal seed layer, can be provided upon a suitable base 1502. Catalyst layer 1500 and base 1502 may be collectively referred to herein as a base. A carbon nanotube film 1504 can be grown on catalyst layer 1500. Eight holes, one of which can be hole 1506, can be formed in carbon nanotube film 1504. This number of holes is only exemplary; there may be more or fewer, i.e., any number could be used. The shape of the holes is likewise exemplary only; the holes can take any shape (e.g., square, rectangular, oval, etc.). These holes 1506 may be formed by patterning catalyst layer 1500 on base 1502 using conventional lithographic techniques. This defines a pattern on the base. Put simply, after catalyst layer 1500 is formed on base 1502, eight holes (not visible), each of which corresponds to the holes, like hole 1506, in carbon nanotube film 1504, can be formed in catalyst layer 1500. As a result, carbon nanotube film 1504 does not grow over the holes (not visible) in catalyst layer 1500. This produces the structure shown in FIG. 15. As mentioned, although eight holes are shown, more or fewer can be used.

Next, a metal layer 1600 can be formed by sputtering or by using conductive epoxy to attach a metal slug in the shape of metal layer 1600 in the same manner as described with reference to FIG. 12.

In FIG. 17, the structure of FIG. 16 is shown inverted with catalyst layer 1500 and base 1502 removed in the same manner as described with the process of FIGS. 11-13, i.e., catalyst layer 1500 can be mechanically ripped from carbon nanotube film 1504 at the juncture of the film and the catalyst layer. As a result, the ends of the holes, like hole 1506, that are exposed in FIG. 17 are the opposite ends from those shown in FIG. 15.

Next, metal can be sputtered, plated, or otherwise deposited onto the upper surface, as viewed in FIG. 17, of carbon nanotube film 1504. This can fill each of the eight holes with round metal posts or studs, like studs 1700, 1702. Stud 1700 is shown exploded from hole 1506 to expose the shape of the stud and to indicate how each of the studs fits into its corresponding hole. Although illustrated as circular and cylindrical, studs 1700, 1702 can be other shapes (e.g., structures with a generally square, rectangular, oval, etc. shape).

As a result of the sputtering, the entire upper surface, as viewed in FIG. 17, of carbon nanotube film 1504 can also be covered with sputtered metal (not shown). Known abrasive planarizing techniques can be used to remove the sputtered metal on the upper surface. This can also planarize the upper surface of carbon nanotube film 1504 with each of the slugs, thus exposing the entire upper surface of film 1504 and the upper surface of each of the studs 1700, 1702 with these surfaces being substantially coplanar as shown in FIG. 17, which is a view after planarization.

The resulting structure of FIG. 17 may be used in several ways. First, it can be used as a contact element mounted on an interconnection element in the same manner that contact element 1400 is mounted on body 1403 in FIG. 14. In other words, the structure of FIG. 17 could be used in lieu of contact element 1400 in the embodiment of FIG. 14. Metal layer 1600 would provide the same structural advantages as metal layer 1200 in the embodiment of FIG. 14—the underside of which also being where the FIG. 17 structure is soldered to wire 1403 or other interconnection element in the same manner that solder connection 1408 connects contact element 1400 to wire 1403.

Secondly, the structure shown in FIG. 17 could be created on a different scale and proportioned to comprise the entire contact structure rather than just the contact element or tip. Put differently, a properly scaled and proportioned structure like that shown in FIG. 17 can be mounted directly on a substrate, i.e., metal layer 1600 can be connected to a substrate terminal, like terminal 1004 in FIG. 10A. Alternatively, the structure shown in FIG. 17 can be proportioned like beam 800 of FIGS. 8 and 9 and attached to posts, like posts 902, 904, which are in turn attached to the terminal of a substrate (like substrate 116). As a result, the carbon nanotube film 1504 and/or the metal posts, like posts 1700, 1702, can provide electrical connection between a pad on a DUT, which can be in pressure contact with the upper surface of carbon nanotube film 1504 in FIG. 17, and the terminal (not shown) on a substrate (also not shown) to which metal layer 1600 can be attached, e.g., with a solder joint (not shown).

The structure shown in FIG. 17 can be any of many different sizes. In some embodiments, for example, the structure of FIG. 17 can be miniature. Non-limiting exemplary dimensions of the structure of FIG. 17 include a width W of about 400 micrometers and a length L of about 800 micrometers. Non-limiting exemplary dimensions of a stud 1700, 1702 include a height H of about 50 micrometers and a diameter D of about 100 micrometers. The foregoing dimensions are exemplary only, and the structure of FIG. 17 can have different dimensions.

In addition, the posts 1700, 1702 can provide rigidity and elasticity for repeated pressure connections with DUT pads, like pads 108 in FIG. 1. And the carbon nanotube film 1504 can provide beneficial properties, such as good thermal and electrical conductivity. In addition, the toughness of the carbon nanotubes that make up film 1504 permit making repeated strong pressure connections between the nanotube film 1504 and DUT pads, like pads 108 in FIG. 1.

Implementing carbon nanotubes into contact structures that are used to make pressure connections to DUT pads may be done for contact structures like those shown in FIGS. 9 and 10 or other types of contact structures. In addition, the embodiments of the invention may be implemented using any kind of manufacturing method for such contact structures.

Having described and illustrated the principles of the invention in exemplary embodiments thereof, it should be apparent that the invention can be modified in arrangement and detail without departing from such principles. We claim all modifications and variation coming within the spirit and scope of the following claims.

The invention claimed is:

1. A contact structure comprising:
   an interconnection element having a first portion that is constructed and arranged for mounting on a substrate and making an electrical connection thereto; and
   a contact element attached to the interconnection element and configured to contact a pad on a semiconductor device,
   wherein the contact element comprises:
      an electrically conductive base attached to the interconnection element, and
      a plurality of carbon nanotubes coupled to and extending away from a surface of the base.

2. The contact structure of claim 1 wherein the interconnection element comprises a wire.

3. The contact structure of claim 1 wherein the interconnection element comprises a beam.

4. The contact structure of claim 1 wherein the contact element further includes a plurality of metal structures disposed on the surface of the base and dispersed among the nanotubes, the metal structures extending from the surface away from the base.

5. The contact structure of claim 4 wherein the metal structures are sputtered metal.

6. A device tested by the contact structure of claim 1.

7. A probe card assembly for testing a semiconductor device having contact pads, the probe card assembly comprising:
   a substrate;
   a plurality of interconnection elements mounted on the substrate and extending upwardly therefrom;

an electrical connection formed between each interconnection element and a conductor in the substrate; and
a contact element electrically connected to each interconnection element and spaced apart from the substrate, wherein each said contact element comprises:
an electrically conductive base attached to one of the interconnection elements, and
a plurality of carbon nanotubes attached to and extending away from a surface of the base.

8. A method of making a contact structure comprising:
defining an opening in a sacrificial layer;
defining a layer of carbon nanotubes on a surface of the opening;
depositing a metallic layer over the carbon nanotubes; and
removing the sacrificial layer, wherein:
the defining a layer of carbon nanotubes on a surface of the opening comprises growing carbon nanotubes in the opening, and
growing the carbon nanotubes in the opening comprises depositing a catalyst in the opening and growing a film of carbon nanotubes on the catalyst.

9. A contact structure made using the method of claim 8.

10. A device tested using the contact structure of claim 9.

11. A contact structure comprising:
an electrically conductive base having a surface;
a plurality of carbon nanotubes attached to and extending away from the surface of the base; and
a plurality of metal structures attached to the surface of the base and dispersed among the nanotubes, the metal structures extending from the surface away from the base.

12. A method of making a contact structure comprising:
defining a pattern on a base;
growing a carbon nanotube film on the defined pattern but not outside of the defined pattern;
creating a plurality of metal structures on the base outside of the defined pattern;
affixing a metal plate to the tops of the film and the structures; and
removing the base.

13. The contact structure of claim 1, wherein:
the plurality of carbon nanotubes are a carbon nanotube film,
a proximal surface of the film is disposed on the surface of the base,
a distal surface of the film is disposed away from the surface of the base, and
the contact element further comprises a metal layer disposed on the distal surface of the film.

14. The contact structure of claim 13, wherein the contact element further comprises holes in the film, and metal disposed in the holes in the film.

15. The contact structure of claim 14, wherein the metal is disposed on the surface of the base and extends to the distal surface of the film.

16. The method of claim 8, wherein the depositing a metallic layer over the carbon nanotubes comprises filling the opening with a metal that comprises the metallic layer.

17. The method of claim 16, wherein the growing the carbon nanotubes in the opening comprises:
depositing the catalyst on a plurality of surfaces of the opening, and
growing a plurality of films of carbon nanotubes on the catalyst on the plurality of surfaces.

18. The method of claim 17, wherein:
the sacrificial layer is disposed on a substrate, and the method further comprise releasing the metallic layer from the substrate, and
the metallic layer comprises a metallic structure in which the layers of carbon nanotubes are embedded with ends of the carbon nanotubes disposed at outer surfaces of the metallic structure.

* * * * *